United States Patent
Liu et al.

(10) Patent No.: US 11,694,005 B2
(45) Date of Patent: Jul. 4, 2023

(54) METHOD, SYSTEM AND EQUIPMENT FOR VEGETATION RESTORATION OR REHABILITATION BASED ON MACHINE LEARNING

(71) Applicant: China Institute of Water Resources and Hydropower Research, Beijing (CN)

(72) Inventors: Guangquan Liu, Beijing (CN); Wanli Shi, Beijing (CN); Liu Liu, Beijing (CN); Chunyu Qi, Beijing (CN); Yingfei Bai, Yan'an (CN); Puhang Li, Yangling (CN); Qiang Zhang, Ordos (CN); Yonggui Chen, Ordos (CN); Heng Fu, Ordos (CN)

(73) Assignee: China Institute of Water Resources and Hydropower Research, Beijing (CN)

( * ) Notice: Subject to any disclaimer, the term of this patent is extended or adjusted under 35 U.S.C. 154(b) by 0 days.

(21) Appl. No.: 17/967,907

(22) Filed: Oct. 18, 2022

(65) Prior Publication Data
US 2023/0123790 A1   Apr. 20, 2023

(30) Foreign Application Priority Data
Oct. 20, 2021   (CN) .......................... 202111218314.5

(51) Int. Cl.
*G06F 30/27*   (2020.01)
(52) U.S. Cl.
CPC .................................... *G06F 30/27* (2020.01)
(58) Field of Classification Search
USPC .......................................................... 703/11
See application file for complete search history.

(56) References Cited

U.S. PATENT DOCUMENTS

| | | | |
|---|---|---|---|
| 2020/0163296 A1 | 5/2020 | Panda et al. | |
| 2021/0118117 A1 | 4/2021 | Albrecht et al. | |
| 2021/0378182 A1* | 12/2021 | Xu | A01G 7/04 |

FOREIGN PATENT DOCUMENTS

| | | |
|---|---|---|
| CN | 102360453 A | 2/2012 |
| CN | 108920674 A | 11/2018 |
| CN | 112084926 A | 12/2020 |

OTHER PUBLICATIONS

Ding Xin-Hui, et al., Evaluation of rocky desertification ecological control technology in the southern karst area based an TOPSIS method, Journal of Sediment Research, 2021, pp. 54-58, vol. 46, No. 2.

(Continued)

*Primary Examiner* — Bryce M Aisaka
(74) *Attorney, Agent, or Firm* — Bayramoglu Law Offices LLC

(57) ABSTRACT

A method for vegetation restoration or rehabilitation of simulating a natural ecosystem based on machine learning (ML) includes: acquiring historical growth environment data of a vegetation community; extracting a site condition feature and a growth condition feature of each vegetation species; restoring and rehabilitating a vegetation community structure selection model; and selecting, based on the vegetation community structure selection model, an optimal vegetation species according to current growth environment data of the vegetation community, and restoring and rehabilitating a vegetation community simulating a natural ecosystem. The method comprehensively considers various factors affecting vegetation restoration based on the site condition and the growth condition. The method has the advantages of simple operation, fast modeling speed, high calculation efficiency, and high screening accuracy and can realize accurate and effective vegetation restoration to improve the quality of the ecological environment.

19 Claims, 2 Drawing Sheets

(56) References Cited

OTHER PUBLICATIONS

Hu Shu-Ping, et al., Application of artificial neural network in optimization of vegetation types in watershed, Journal of Beijing Forestry University, 2008, pp. 1-5, vol. 30, Supp.2.

* cited by examiner

METHOD, SYSTEM AND EQUIPMENT FOR VEGETATION RESTORATION OR REHABILITATION BASED ON MACHINE LEARNING

CROSS REFERENCE TO THE RELATED APPLICATIONS

This application is based upon and claims priority to Chinese Patent Application No. 202111218314.5, filed on Oct. 20, 2021, the entire contents of which are incorporated herein by reference.

TECHNICAL FIELD

The present disclosure relates to the technical field of vegetation restoration, in particular, to a method, system, and equipment for vegetation restoration or rehabilitation of simulating a natural ecosystem based on machine learning (ML).

BACKGROUND

Vegetation restoration is an effective measure to curb the deterioration of the ecological environment and improve the fragile and degraded ecosystems. There is consensus in the ecological community that the key to ecological restoration of China's Loess Plateau is vegetation restoration and rehabilitation. For the past few years, China has carried out a large number of vegetation restoration work in hilly and gully areas of the Loess Plateau affected by serious soil erosion. Since 1999, the implementation of the returning farmland to forest (grassland) project has further comprehensively promoted the process of regional ecological construction. The implementation of a series of ecological construction projects and supporting policies has promoted regional economic development and solved the existing problems of destructing while harnessing ecological environment for several decades, resulting in its partial improvement but overall deterioration.

The project of restoring farmland to forest (grassland) is a specific measure for the adjustment of land use structure, which can cause large-scale and transformative changes of land cover, which has a significant impact on the regional ecological environment. The ecological goal of the project is to construct a healthy forest ecosystem and realize its service function value based on increasing forest coverage. However, due to the harsh natural conditions, improper selection of tree species and poor management, the survival rate and preservation rate of afforestation in some areas are low. Due to the poor growth of forest stands, it is difficult to form an effective protective structure or a stable forest environment. As a result, the forest cannot play its important role in improving soil, promoting rainfall infiltration, controlling soil erosion, and the like, which reduces the ecological benefits of the project.

In the existing methods of recovering reforestation and returning farmland to forests uses, manual discussion is relied on, and the vegetation species is selected based on only a single site condition, which inevitably leads to problems, such as high labor cost, low screening accuracy, and the like.

SUMMARY

In order to overcome the deficiencies in the prior art, the present disclosure provides a method, system, and equipment for vegetation restoration or rehabilitation of simulating a natural ecosystem based on machine learning (ML).

In order to achieve the above objective, the present disclosure adopts the following technical solutions:

A first aspect of the present disclosure provides a method for vegetation restoration or rehabilitation of simulating a natural ecosystem based on ML, which includes the following steps:

acquiring historical growth environment data of a vegetation community;

extracting a site condition feature and a growth condition feature of each vegetation species from the historical growth environment data;

rehabilitating a vegetation community structure selection model based on the site condition feature and the growth condition feature of the vegetation species; and selecting, based on the vegetation community structure selection model, an optimal vegetation species according to current growth environment data of the vegetation community, and rehabilitating a vegetation community simulating a natural ecosystem.

Further, the site condition feature of the vegetation species includes slope aspect, slope gradient, slope position, and micro-topography of a geographical environment where the vegetation species is located.

The slope aspect of the geographical environment where the vegetation species is located specifically includes one of sunny slope, semi-sunny slope, semi-shady slope, and shady slope.

The slope gradient of the geographical environment where the vegetation species is located specifically includes one of slight slope, gentle slope, abrupt slope, steep slope, sharp slope, and dangerous slope.

The slope position of the geographical environment where the vegetation species is located specifically includes one of ridge slope, upper slope, middle slope, lower slope, and valley slope.

The micro-topography of the geographical environment where the vegetation species is located specifically includes one of gentle platform, subsidence, long gully, shallow gully, and scarp.

Further, the growth condition feature of the vegetation species includes sunshine hours, soil moisture, air temperature, air pressure, and relative humidity of a meteorological environment where the vegetation species is located.

Further, restoring and rehabilitating a vegetation community structure selection model based on the site condition feature and the growth condition feature of the vegetation species specifically includes the following sub-steps:

acquiring growth condition features of the meteorological environment where the vegetation species is located, and selecting a most correlated growth condition feature of the vegetation species;

acquiring site condition features of the geographical environment where the vegetation species is located, and selecting a most correlated site condition feature of the vegetation species;

setting up, based on the selected most correlated growth condition feature and site condition feature of the vegetation species, a sample database of a one-to-one correspondence; and training, based on the sample database, the vegetation community structure selection model by an ML method, and determining a correspondence between the growth condition feature and the vegetation species and a correspondence between the site condition feature and the vegetation species.

Further, acquiring growth condition features of the meteorological environment where the vegetation species is located, and selecting a most correlated growth condition feature of the vegetation species specifically includes the following sub-steps:

acquiring the growth condition feature of the meteorological environment where the vegetation species is located, and constructing a growth condition feature matrix;

setting a growth condition threshold, and constructing a growth condition threshold matrix;

calculating a correlation coefficient between each growth condition feature and the corresponding growth condition threshold;

calculating, based on the calculated correlation coefficient, a correlation order of each growth condition feature; and sorting by the calculated correlation order, and selecting a growth condition feature with a maximum correlation order.

Further, acquiring site condition features of the geographical environment where the vegetation species is located, and selecting a most correlated site condition feature of the vegetation species specifically includes the following sub-steps:

acquiring the site condition feature of the geographical environment where the vegetation species is located, and constructing a site condition feature matrix;

setting a site condition threshold, and constructing a site condition threshold matrix;

calculating a correlation coefficient between each site condition feature and the corresponding site condition threshold;

calculating, based on the calculated correlation coefficient, a correlation order of each site condition feature; and sorting by the calculated correlation order, and selecting a site condition feature with a maximum correlation order.

Further, training, based on the sample database, the vegetation community structure selection model by an ML method, and determining a correspondence between the growth condition feature and the vegetation species and a correspondence between the site condition feature and the vegetation species specifically includes the following sub-steps:

acquiring a sample data in the sample database as a training sample;

normalizing the sample data;

setting a number of hidden layers;

initializing an evolution count, a population size, a crossover probability, and a mutation probability;

encoding a population in a real number, and taking an error between predicted data and expected data as a fitness function;

cycling through selection, crossover, mutation, and fitness calculation until the evolution count is reached, so as to acquire an optimal initial weight and an optimal threshold;

taking the acquired optimal initial weight and optimal threshold as a weight and a threshold between initial neurons of a neural network, and restoring and rehabilitating the vegetation community structure selection model; and training, by the training sample, the vegetation community structure selection model, and constructing the correspondence between the growth condition feature and the vegetation species and the correspondence between the site condition feature and the vegetation species.

A second aspect of the present disclosure provides a system for vegetation restoration or rehabilitation of simulating a natural ecosystem based on ML, including:

a data acquisition module configured to acquire historical growth environment data of a vegetation community;

a data extraction module configured to extract a site condition feature and a growth condition feature of each vegetation species from the historical growth environment data;

a model constructing module configured to restore and rehabilitate a vegetation community structure selection model based on the site condition feature and the growth condition feature of the vegetation species; and a vegetation community constructing module configured to select, based on the vegetation community structure selection model, an optimal vegetation species according to current growth environment data of the vegetation community, and restore and rehabilitate a vegetation community simulating a natural ecosystem.

A third aspect of the present disclosure provides an equipment for vegetation restoration or rehabilitation of simulating a natural ecosystem based on ML, including:

a memory configured to store a computer program; and a processor configured to execute the computer program to implement the method for vegetation restoration or rehabilitation of simulating a natural ecosystem based on ML.

A fourth aspect of the present disclosure provides a computer-readable storage medium, in which a computer program is stored, where the computer program is executed by a processor to implement the method for vegetation restoration or rehabilitation of simulating a natural ecosystem based on ML.

The present disclosure has the following beneficial effects.

The present disclosure restores and rehabilitates the vegetation community structure selection model based on the site condition feature and the growth condition feature of each vegetation species extracted from the historical growth environment data of the vegetation community. The present disclosure selects the optimal vegetation species according to the current growth environment data of the vegetation community through the vegetation community structure selection model and restores and rehabilitates a vegetation community simulating a natural ecosystem. The present disclosure comprehensively considers various factors affecting vegetation restoration based on the site condition and the growth condition. The present disclosure has the advantages of simple operation, fast modeling speed, high calculation efficiency, and high screening accuracy, and can realize accurate and effective vegetation restoration to improve the quality of the ecological environment.

DETAILED DESCRIPTION OF THE EMBODIMENTS

The specific implementations of the present disclosure are described below to facilitate understanding by those skilled in the art of the present disclosure, but it should be clear that the present disclosure is not limited to the scope of the specific implementations. Various obvious changes made by those of ordinary skill in the art within the spirit and scope of the present disclosure defined by the appended claims should fall within the protection scope of the present disclosure.

Figure 1:
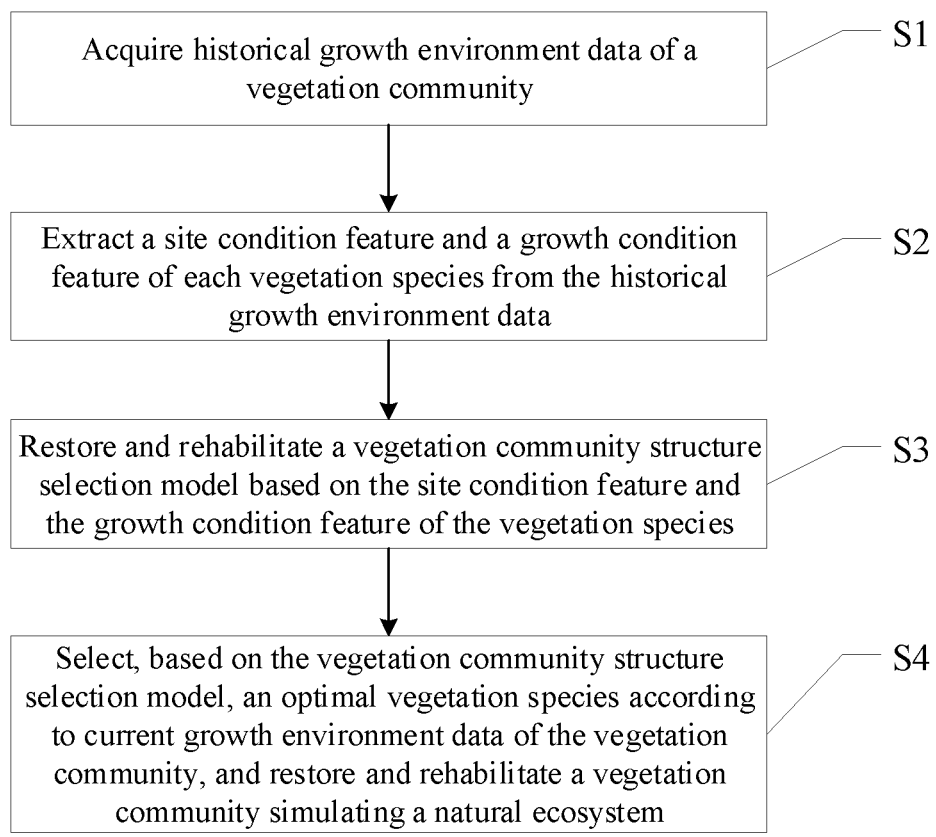
FIG. 1 is a flowchart of a method for vegetation restoration or rehabilitation of simulating a natural ecosystem based on machine learning (ML) according to an embodiment of the present disclosure.

As shown in FIG. 1, an embodiment of the present disclosure provides a method for vegetation restoration or rehabilitation of simulating a natural ecosystem based on machine learning (ML), including steps S1 to S4.

S1. Acquire historical growth environment data of a vegetation community.

In this step, the present disclosure acquires the historical growth environment data of the vegetation community in a target area by means of on-the-spot investigation and instrument observation to provide effective training data for the subsequent training of the vegetation community structure selection model.

The historical growth environment data of the vegetation community used in the present disclosure includes the site condition feature of the geographical environment where the vegetation is located and the growth condition feature of the meteorological environment where the vegetation is located. The present disclosure comprehensively considers a variety of factors affecting vegetation restoration based on the site condition and the growth condition, thereby significantly improving the screening accuracy of the vegetation community structure selection model.

S2. Extract a site condition feature and a growth condition feature of each vegetation species from the historical growth environment data.

In this step, the present disclosure extracts each vegetation species and the site condition feature and growth condition feature thereof from the historical growth environment data of the vegetation community acquired in step S1.

The site condition feature of the vegetation species includes slope aspect, slope gradient, slope position, and micro-topography of a geographical environment where the vegetation species is located.

The slope aspect of the geographical environment where the vegetation species is located specifically includes one of sunny slope, semi-sunny slope, semi-shady slope, and shady slope.

The slope gradient of the geographical environment where the vegetation species is located specifically includes one of slight slope, gentle slope, abrupt slope, steep slope, sharp slope, and dangerous slope.

The slope position of the geographical environment where the vegetation species is located specifically includes one of ridge slope, upper slope, middle slope, lower slope, and valley slope.

The micro-topography of the geographical environment where the vegetation species is located specifically includes one of gentle platform, subsidence, long gully, shallow gully, and scarp.

The present disclosure extracts the slope aspect, slope gradient, slope position, and micro-topography of the geographical environment where the vegetation species is located, and analyzes the vegetation growth situation under each site condition according to the vegetation mortality rate and renewal rate under each site condition. The present disclosure selects the vegetation species suitable for vegetation restoration under various site conditions and ensures the normal growth and natural renewal of the selected vegetation species.

The growth condition feature of the vegetation species includes sunshine hours, soil moisture, air temperature, air pressure, and relative humidity of a meteorological environment where the vegetation species is located.

The present disclosure extracts the sunshine hours, soil moisture, air temperature, air pressure, and relative humidity of the meteorological environment where the vegetation species is located. The present disclosure analyzes the vegetation growth under each growth condition according to the data of the perimeter change of the vegetation under each growth condition and selects the vegetation species suitable for vegetation restoration under each growth condition. Therefore, the present disclosure ensures that the selected vegetation species has strong adaptability to the local environment.

S3. Restore and rehabilitate vegetation community structure selection model based on the site condition feature and the growth condition feature of the vegetation species.

In this step, restoring and rehabilitating a vegetation community structure selection model based on the site condition feature and the growth condition feature of the vegetation species specifically includes the following sub-steps:

S3-1. Acquire growth condition features of the meteorological environment where the vegetation species is located and select a most correlated growth condition feature of the vegetation species.

In this sub-step, acquiring growth condition features of the meteorological environment where the vegetation species is located and selecting a most correlated growth condition feature of the vegetation species specifically includes the following sub-steps:

S3-1-1. Acquire the growth condition feature of the meteorological environment where the vegetation species is located and construct a growth condition feature matrix:

$$(X_1, X_2, \ldots, X_n) = \begin{pmatrix} x_2(1) & x_2(1) & \ldots & x_n(1) \\ x_1(2) & x_2(2) & \ldots & x_n(2) \\ \ldots & \ldots & \ldots & \ldots \\ x_1(m) & x_2(m) & \ldots & x_n(m) \end{pmatrix}$$

In the formula, $X_1, X_2, \ldots, X_n$ denote the growth condition features of the meteorological environment where the vegetation species is located, $x_1(1), x_2(2), \ldots, x_m(m)$ denote specific values of the growth condition feature $X_1$ of the meteorological environment where the vegetation species is located, n denotes a count of the growth condition features of the meteorological environment where the vegetation species is located, and m denotes a count of the specific values of the growth condition feature of the meteorological environment where the vegetation species is located. For example, the sunshine hours of the meteorological environment where the vegetation species is located is denoted as $X_1$, and the specific value of the sunshine hours of the meteorological environment where the vegetation species is located is denoted as $x_1(1)$.

S3-1-2. Set a growth condition threshold and construct a growth condition threshold matrix:

$$X_0 = (x_0(1), x_0(2) \ldots, x_0(m))$$

In the formula, $x_0(1), x_0(2), \ldots, x_0(m)$ denotes the growth condition thresholds. For example, the threshold of the sunshine hours in the meteorological environment where the vegetation species is located is denoted as $x_0(1)$.

S3-1-3. Calculate a correlation coefficient between each growth condition feature and the corresponding growth condition threshold:

$$\zeta_i(k) = \frac{\min_i |x_0(k) - x_i(k)| + \rho \cdot \max_i |x_0(k) - x_i(k)|}{|x_0(k) - x_i(k)| + \rho \cdot \max_i |x_0(k) - x_i(k)|}$$

In the formula, $\rho$ denotes a set resolution coefficient corresponding to the growth condition, i denotes a serial number of the growth condition feature of the meteorological environment where the vegetation species is located, and k denotes a serial number of the specific value of the growth condition feature of the meteorological environment where the vegetation species is located.

The present disclosure directly calculates the correlation coefficient based on the raw data, which simplifies the calculation, improves the calculation effect, and avoids the negative impact on the features caused by the traditional normalization process.

S3-1-4. Calculate, based on the calculated correlation coefficient, a correlation order of each growth condition feature:

$$r_{0i} = \frac{1}{m} \sum_{k=1}^{m} W_k \zeta_i(k)$$

In the formula, $W_k$ denotes a weight of the growth condition feature of the meteorological environment where the vegetation species is located.

S3-1-5. Sort by the calculated correlation order and select a growth condition feature with a maximum correlation order.

S3-2. Acquire site condition features of the geographical environment where the vegetation species is located and select a most correlated site condition feature of the vegetation species.

In this sub-step, acquiring site condition features of the geographical environment where the vegetation species is located and selecting a most correlated site condition feature of the vegetation species specifically includes the following sub-steps:

S3-2-1. Acquire the site condition feature of the geographical environment where the vegetation species is located and construct a site condition feature matrix:

$$(Y_1, Y_2 \ldots, Y_p) = \begin{pmatrix} y_1(1) & y_2(1) & \ldots & y_n(1) \\ y_1(2) & y_2(2) & \ldots & y_n(2) \\ \ldots & \ldots & \ldots & \ldots \\ y_1(q) & y_2(q) & \ldots & y_n(q) \end{pmatrix}$$

In the formula, $Y_1, Y_2 \ldots, Y_p$ denote the growth condition features of the meteorological environment where the vegetation species is located, $y_1(1), y_1(2) \ldots, y_1(q)$ denote specific values of the growth condition feature $Y_1$ of the meteorological environment where the vegetation species is located, p denotes a count of the growth condition features of the meteorological environment where the vegetation species is located, and q denotes a count of the specific values of the growth condition feature of the meteorological environment where the vegetation species is located. For example, the sunshine hours of the meteorological environment where the vegetation species is located is denoted as $Y_1$, and the specific value of the sunshine hours of the meteorological environment where the vegetation species is located is denoted as $y_1(1)$.

S3-2-2. Set a site condition threshold and construct a site condition threshold matrix:

$$Y_0 = (y_0(1), y_0(2) \ldots, y_0(q))$$

In the formula, $y_0(1), y_0(2) \ldots, y_0(q)$ denotes the growth condition thresholds. For example, the threshold of the sunshine hours in the meteorological environment where the vegetation species is located is denoted as $y_0(1)$.

S3-2-3. Calculate a correlation coefficient between each site condition feature and the corresponding site condition threshold:

$$\xi_j(l) = \frac{\min_j |y_0(l) - y_j(l)| + \sigma \cdot \max_j |y_0(l) - y_j(l)|}{|y_0(l) - y_j(l)| + \sigma \cdot \max_j |y_0(l) - y_j(l)|}$$

In the formula, $\sigma$ denotes a set resolution coefficient corresponding to the site condition, j denotes a serial number of the growth condition feature of the meteorological environment where the vegetation species is located, and l denotes a serial number of the specific value of the growth condition feature of the meteorological environment where the vegetation species is located.

S3-2-4. Calculate, based on the calculated correlation coefficient, a correlation order of each site condition feature:

$$r_{0j} = \frac{1}{q} \sum_{l=1}^{q} W_l \xi_j(l)$$

In the formula, $W_l$ denotes a weight of the growth condition feature of the meteorological environment where the vegetation species is located.

S3-2-5: Sort by the calculated correlation order and select a site condition feature with a maximum correlation order.

S3-3. Set up, based on the selected most correlated growth condition feature and site condition feature of the vegetation species, a sample database of a one-to-one correspondence.

In this step, according to the most relevant growth condition feature of each vegetation species selected in step S3-1 and the most relevant site condition feature of each vegetation species selected in step S3-2, the present disclosure establishes the sample database of a one-to-one correspondence between each vegetation species and the most relevant growth condition feature and site condition feature thereof.

S3-4. Train, based on the sample database, the vegetation community structure selection model by an ML method, and determine a correspondence between the growth condition feature and the vegetation species and a correspondence between the site condition feature and the vegetation species.

In this step, training, based on the sample database, the vegetation community structure selection model by an ML method, and determining a correspondence between the growth condition feature and the vegetation species and a correspondence between the site condition feature and the vegetation species specifically includes the following sub-steps:

S3-4-1. Acquire a sample data in the sample database as a training sample.

S3-4-2. Normalize the sample data.

S3-4-3. Set a number of hidden layers.

S3-4-4. Initialize an evolution count, a population size, a crossover probability, and a mutation probability.

S3-4-5. Encode a population in a real number and take an error between predicted data and expected data as a fitness function.

S3-4-6. Cycle through selection, crossover, mutation, and fitness calculation until the evolution count is reached to acquire an optimal initial weight and an optimal threshold.

S3-4-7. Take the acquired optimal initial weight and optimal threshold as a weight and a threshold between initial neurons of a neural network and restore and rehabilitate the vegetation community structure selection model.

S3-4-8. Train, by the training sample, the vegetation community structure selection model, and construct the correspondence between the growth condition feature and the vegetation species and the correspondence between the site condition feature and the vegetation species.

The present disclosure optimizes the constructing of the neural network through a genetic algorithm, which avoids the problem of local minimum caused by the random selection of weights and thresholds between the initial neurons of the traditional neural network, thereby improving the robustness and accuracy of the model.

S4. Select, based on the vegetation community structure selection model, an optimal vegetation species according to current growth environment data of the vegetation community, and restore and rehabilitate a vegetation community simulating a natural ecosystem.

The embodiment of the method for vegetation restoration or rehabilitation of simulating a natural ecosystem based on ML provided by the present disclosure is described in detail above. The present disclosure further provides a system and equipment for vegetation restoration or rehabilitation of simulating a natural ecosystem based on ML and a computer-readable storage medium, which are corresponding to the method. The embodiments of the system, the equipment, and the computer-readable storage medium are corresponding to the embodiment of the method. Therefore, for the embodiments of the system, the equipment, and the computer-readable storage medium, reference is made to the description of the embodiment of the method, and details will not be repeated herein.

Figure 2:
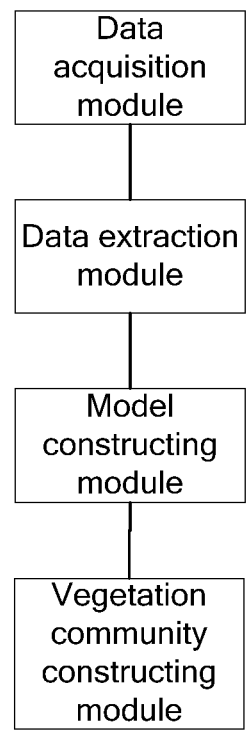
FIG. 2 is a structural diagram of a system for vegetation restoration or rehabilitation of simulating a natural ecosystem based on ML according to an embodiment of the present disclosure.

FIG. 2 shows a system for vegetation restoration or rehabilitation of simulating a natural ecosystem based on ML according to an embodiment of the present disclosure. The system includes:

a data acquisition module configured to acquire historical growth environment data of a vegetation community;

a data extraction module configured to extract a site condition feature and a growth condition feature of each vegetation species from the historical growth environment data;

a model constructing module configured to restore and rehabilitate a vegetation community structure selection model based on the site condition feature and the growth condition feature of the vegetation species; and a vegetation community constructing module configured to select, based on the vegetation community structure selection model, an optimal vegetation species according to current growth environment data of the vegetation community and restore and rehabilitate a vegetation community simulating a natural ecosystem.

The system for vegetation restoration or rehabilitation of simulating a natural ecosystem based on ML provided by the embodiment of the present disclosure has the same beneficial effects as the method for vegetation restoration or rehabilitation of simulating a natural ecosystem based on ML.

Figure 3:
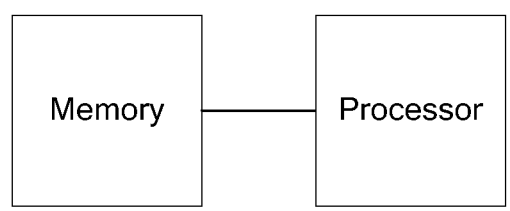
FIG. 3 is a structural diagram of an equipment for vegetation restoration or rehabilitation of simulating a natural ecosystem based on ML according to an embodiment of the present disclosure.

FIG. 3 shows an equipment for vegetation restoration or rehabilitation of simulating a natural ecosystem based on ML according to an embodiment of the present disclosure. The equipment includes:

a memory configured to store a computer program; and a processor configured to execute the computer program to implement the method for vegetation restoration or rehabilitation of simulating a natural ecosystem based on ML.

The equipment for vegetation restoration or rehabilitation of simulating a natural ecosystem based on ML provided by the embodiment of the present disclosure has the same beneficial effects as the method for vegetation restoration or rehabilitation of simulating a natural ecosystem based on ML.

An embodiment of the present disclosure provides a computer-readable storage medium, in which a computer program is stored, where the computer program is executed by a processor to implement the method for vegetation restoration or rehabilitation of simulating a natural ecosystem based on ML.

The computer-readable storage medium provided by the embodiment of the present disclosure has the same beneficial effects as the method for vegetation restoration or rehabilitation of simulating a natural ecosystem based on ML.

The present disclosure, which provides the method, the equipment (system), and the computer program product according to the embodiments, is described with reference to the flowcharts and/or block diagrams. Computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of another programmable data processing equipment to form a machine, such that the instructions executed by a computer or a processor of another programmable data processing equipment form an apparatus for implementing a specific function in one or more processes in the flowcharts and/or in one or more blocks in the block diagrams.

These computer program instructions may be stored in a computer-readable memory that can instruct the computer or any other programmable data processing equipment to work in a specific manner, such that the instructions stored in the computer-readable memory form an artifact that includes an instruction apparatus. The instruction apparatus implements a specific function in one or more processes in the flowcharts and/or in one or more blocks in the block diagrams.

These computer program instructions may be loaded onto a computer or another programmable data processing equipment, such that a series of operations and steps are performed on the computer or another programmable equipment, thereby generating computer-implemented processing. Therefore, the instructions executed on the computer or another programmable equipment provide steps for implementing a specific function in one or more processes in the flowcharts and/or in one or more blocks in the block diagrams.

In this specification, specific embodiments are used to describe the principle and implementations of the present disclosure, and the description of the embodiments is only intended to help explain the method and core idea of the present disclosure. Meanwhile, a person of ordinary skill in the art may, based on the idea of the present disclosure, make modifications to the specific implementations and the application scope. Therefore, the content of this specification shall not be construed as a limitation to the present disclosure.

Those of ordinary skill in the art should understand that the embodiments described herein are intended to help readers understand the principles of the present disclosure, and it should be understood that the protection scope of the present disclosure is not limited to such specific statements and embodiments. Those of ordinary skill in the art may make other various specific modifications and combinations according to the technical teachings disclosed in the present disclosure without departing from the essence of the present disclosure, and such modifications and combinations should fall within the protection scope of the present disclosure.

What is claimed is:

1. A method for a vegetation restoration or rehabilitation, the method being based on machine learning (ML) and comprising:
    acquiring historical growth environment data of a vegetation community;
    extracting a site condition feature and a growth condition feature of each vegetation species from the historical growth environment data;
    restoring and rehabilitating a vegetation community structure selection model based on the site condition feature and the growth condition feature of the vegetation species, specifically comprising the following sub-steps:
        acquiring growth condition features of a meteorological environment where the vegetation species is located and selecting a most correlated growth condition feature of the vegetation species;
        acquiring site condition features of a geographical environment where the vegetation species is located and selecting a most correlated site condition feature of the vegetation species;
        establishing, based on the selected most correlated growth condition feature and site condition feature of the vegetation species, a sample database of a one-to-one correspondence; and
        training, based on the sample database, the vegetation community structure selection model by an ML method, and determining a correspondence between the growth condition feature and the vegetation species and a correspondence between the site condition feature and the vegetation species; and
    selecting, based on the vegetation community structure selection model, an optimal vegetation species according to current growth environment data of the vegetation community, and restoring and rehabilitating the vegetation community to simulate a natural ecosystem.

2. The method according to claim 1, wherein the site condition feature of the vegetation species comprises a slope aspect, a slope gradient, a slope position, and a micro-topography of the geographical environment where the vegetation species is located;
    the slope aspect of the geographical environment where the vegetation species is located specifically comprises one of sunny slope, semi-sunny slope, semi-shady slope, and shady slope;
    the slope gradient of the geographical environment where the vegetation species is located specifically comprises one of slight slope, gentle slope, abrupt slope, steep slope, sharp slope, and dangerous slope;
    the slope position of the geographical environment where the vegetation species is located specifically comprises one of ridge slope, upper slope, middle slope, lower slope, and valley slope; and
    the micro-topography of the geographical environment where the vegetation species is located specifically comprises one of gentle platform, subsidence, long gully, shallow gully, and scarp.

3. The method according to claim 2, wherein the growth condition feature of the vegetation species comprises sunshine hours, soil moisture, air temperature, air pressure, and relative humidity of the meteorological environment where the vegetation species is located.

4. The method according to claim 1, wherein the step of acquiring the growth condition features of the meteorological environment where the vegetation species is located and selecting the most correlated growth condition feature of the vegetation species specifically comprises the following sub-steps:
    acquiring the growth condition feature of the meteorological environment where the vegetation species is located and constructing a growth condition feature matrix;
    setting a growth condition threshold and constructing a growth condition threshold matrix;
    calculating a correlation coefficient between each growth condition feature and the corresponding growth condition threshold;
    calculating, based on the calculated correlation coefficient, a correlation order of each growth condition feature; and
    sorting by the calculated correlation order and selecting a growth condition feature with a maximum correlation order.

5. The method according to claim 4, wherein the step of acquiring the site condition features of the geographical environment where the vegetation species is located, and selecting the most correlated site condition feature of the vegetation species specifically comprises the following sub-steps:
    acquiring the site condition feature of the geographical environment where the vegetation species is located and constructing a site condition feature matrix;
    setting a site condition threshold and constructing a site condition threshold matrix;
    calculating a correlation coefficient between each site condition feature and the corresponding site condition threshold;
    calculating, based on the calculated correlation coefficient, a correlation order of each site condition feature; and
    sorting by the calculated correlation order and selecting a site condition feature with a maximum correlation order.

6. The method according to claim 5, wherein the step of training, based on the sample database, the vegetation community structure selection model by the ML method, and determining the correspondence between the growth condition feature and the vegetation species and the correspondence between the site condition feature and the vegetation species specifically comprises the following sub-steps:
    acquiring sample data in the sample database as a training sample;
    normalizing the sample data;
    setting a number of hidden layers;
    initializing an evolution count, a population size, a crossover probability, and a mutation probability;

encoding a population in a real number, and taking an error between predicted data and expected data as a fitness function;

cycling through a selection, a crossover, a mutation, and a fitness calculation until the evolution count is reached, to acquire an optimal initial weight and an optimal threshold;

taking the acquired optimal initial weight and the optimal threshold as a weight and a threshold between initial neurons of a neural network, and restoring and rehabilitating the vegetation community structure selection model; and training, by the training sample, the vegetation community structure selection model, and constructing the correspondence between the growth condition feature and the vegetation species and the correspondence between the site condition feature and the vegetation species.

7. An equipment for a vegetation restoration or rehabilitation, the equipment being based on machine learning (ML) and comprising:

a memory configured to store a computer program; and a processor configured to execute the computer program to implement the method according to claim 1.

8. The equipment according to claim 7, wherein the site condition feature of the vegetation species comprises a slope aspect, a slope gradient, a slope position, and a micro-topography of the geographical environment where the vegetation species is located;

the slope aspect of the geographical environment where the vegetation species is located specifically comprises one of sunny slope, semi-sunny slope, semi-shady slope, and shady slope;

the slope gradient of the geographical environment where the vegetation species is located specifically comprises one of slight slope, gentle slope, abrupt slope, steep slope, sharp slope, and dangerous slope;

the slope position of the geographical environment where the vegetation species is located specifically comprises one of ridge slope, upper slope, middle slope, lower slope, and valley slope; and the micro-topography of the geographical environment where the vegetation species is located specifically comprises one of gentle platform, subsidence, long gully, shallow gully, and scarp.

9. The equipment according to claim 8, wherein the growth condition feature of the vegetation species comprises sunshine hours, soil moisture, air temperature, air pressure, and relative humidity of the meteorological environment where the vegetation species is located.

10. The equipment according to claim 7, wherein the acquiring the growth condition features of the meteorological environment where the vegetation species is located and selecting the most correlated growth condition feature of the vegetation species specifically comprises the following sub-steps:

acquiring the growth condition feature of the meteorological environment where the vegetation species is located and constructing a growth condition feature matrix;

setting a growth condition threshold and constructing a growth condition threshold matrix;

calculating a correlation coefficient between each growth condition feature and the corresponding growth condition threshold;

calculating, based on the calculated correlation coefficient, a correlation order of each growth condition feature; and sorting by the calculated correlation order and selecting a growth condition feature with a maximum correlation order.

11. The equipment according to claim 10, wherein the acquiring the site condition features of the geographical environment where the vegetation species is located, and selecting the most correlated site condition feature of the vegetation species specifically comprises the following sub-steps:

acquiring the site condition feature of the geographical environment where the vegetation species is located and constructing a site condition feature matrix;

setting a site condition threshold and constructing a site condition threshold matrix;

calculating a correlation coefficient between each site condition feature and the corresponding site condition threshold;

calculating, based on the calculated correlation coefficient, a correlation order of each site condition feature; and sorting by the calculated correlation order and selecting a site condition feature with a maximum correlation order.

12. The equipment according to claim 11, wherein the training, based on the sample database, the vegetation community structure selection model by the ML method, and determining the correspondence between the growth condition feature and the vegetation species and the correspondence between the site condition feature and the vegetation species specifically comprises the following sub-steps:

acquiring sample data in the sample database as a training sample;

normalizing the sample data;

setting a number of hidden layers;

initializing an evolution count, a population size, a crossover probability, and a mutation probability;

encoding a population in a real number, and taking an error between predicted data and expected data as a fitness function;

cycling through a selection, a crossover, a mutation, and a fitness calculation until the evolution count is reached, to acquire an optimal initial weight and an optimal threshold;

taking the acquired optimal initial weight and the optimal threshold as a weight and a threshold between initial neurons of a neural network, and restoring and rehabilitating the vegetation community structure selection model; and training, by the training sample, the vegetation community structure selection model, and constructing the correspondence between the growth condition feature and the vegetation species and the correspondence between the site condition feature and the vegetation species.

13. A computer-readable storage medium, wherein a computer program is stored in the computer-readable storage medium, and the computer program is executed by a processor to implement the method according to claim 1.

14. The computer-readable storage medium according to claim 13, wherein the site condition feature of the vegetation species comprises a slope aspect, a slope gradient, a slope position, and a micro-topography of the geographical environment where the vegetation species is located;

the slope aspect of the geographical environment where the vegetation species is located specifically comprises one of sunny slope, semi-sunny slope, semi-shady slope, and shady slope;
the slope gradient of the geographical environment where the vegetation species is located specifically comprises one of slight slope, gentle slope, abrupt slope, steep slope, sharp slope, and dangerous slope;
the slope position of the geographical environment where the vegetation species is located specifically comprises one of ridge slope, upper slope, middle slope, lower slope, and valley slope; and
the micro-topography of the geographical environment where the vegetation species is located specifically comprises one of gentle platform, subsidence, long gully, shallow gully, and scarp.

15. The computer-readable storage medium according to claim 14, wherein the growth condition feature of the vegetation species comprises sunshine hours, soil moisture, air temperature, air pressure, and relative humidity of the meteorological environment where the vegetation species is located.

16. The computer-readable storage medium according to claim 13, wherein the acquiring the growth condition features of the meteorological environment where the vegetation species is located and selecting the most correlated growth condition feature of the vegetation species specifically comprises the following sub-steps:
acquiring the growth condition feature of the meteorological environment where the vegetation species is located and constructing a growth condition feature matrix;
setting a growth condition threshold and constructing a growth condition threshold matrix;
calculating a correlation coefficient between each growth condition feature and the corresponding growth condition threshold;
calculating, based on the calculated correlation coefficient, a correlation order of each growth condition feature; and
sorting by the calculated correlation order and selecting a growth condition feature with a maximum correlation order.

17. The computer-readable storage medium according to claim 16, wherein the acquiring the site condition features of the geographical environment where the vegetation species is located, and selecting the most correlated site condition feature of the vegetation species specifically comprises the following sub-steps:
acquiring the site condition feature of the geographical environment where the vegetation species is located and constructing a site condition feature matrix;
setting a site condition threshold and constructing a site condition threshold matrix;
calculating a correlation coefficient between each site condition feature and the corresponding site condition threshold;
calculating, based on the calculated correlation coefficient, a correlation order of each site condition feature; and
sorting by the calculated correlation order and selecting a site condition feature with a maximum correlation order.

18. The computer-readable storage medium according to claim 17, wherein the training, based on the sample database, the vegetation community structure selection model by the ML method, and determining the correspondence between the growth condition feature and the vegetation species and the correspondence between the site condition feature and the vegetation species specifically comprises the following sub-steps:
acquiring sample data in the sample database as a training sample;
normalizing the sample data;
setting a number of hidden layers;
initializing an evolution count, a population size, a crossover probability, and a mutation probability;
encoding a population in a real number, and taking an error between predicted data and expected data as a fitness function;
cycling through a selection, a crossover, a mutation, and a fitness calculation until the evolution count is reached, to acquire an optimal initial weight and an optimal threshold;
taking the acquired optimal initial weight and the optimal threshold as a weight and a threshold between initial neurons of a neural network, and restoring and rehabilitating the vegetation community structure selection model; and
training, by the training sample, the vegetation community structure selection model, and constructing the correspondence between the growth condition feature and the vegetation species and the correspondence between the site condition feature and the vegetation species.

19. A system for a vegetation restoration or rehabilitation, the system being based on machine learning (ML) and comprising:
a data acquisition module configured to acquire historical growth environment data of a vegetation community;
a data extraction module configured to extract a site condition feature and a growth condition feature of each vegetation species from the historical growth environment data;
a model constructing module configured to restore and rehabilitate a vegetation community structure selection model based on the site condition feature and the growth condition feature of the vegetation species, specifically to
acquire growth condition features of a meteorological environment where the vegetation species is located and select a most correlated growth condition feature of the vegetation species;
acquire site condition features of a geographical environment where the vegetation species is located and select a most correlated site condition feature of the vegetation species;
establish, based on the selected most correlated growth condition feature and site condition feature of the vegetation species, a sample database of a one-to-one correspondence; and
train, based on the sample database, the vegetation community structure selection model by an ML method, and determine a correspondence between the growth condition feature and the vegetation species and a correspondence between the site condition feature and the vegetation species; and
a vegetation community constructing module configured to select, based on the vegetation community structure selection model, an optimal vegetation species according to current growth environment data of the vegetation community and restore and rehabilitate the vegetation community to simulate a natural ecosystem.

* * * * *